United States Patent [19]

McCormack

[11] Patent Number: 4,904,953

[45] Date of Patent: Feb. 27, 1990

[54] DIFFERENTIAL AMPLIFIER WITH COMMON-MODE BIAS FEEDBACK

[75] Inventor: Gary D. McCormack, Aloha, Oreg.

[73] Assignee: TriQuint Semiconductor, Inc., Beaverton, Oreg.

[21] Appl. No.: 185,000

[22] Filed: Apr. 22, 1988

[51] Int. Cl.$^4$ .......................... H03F 3/45; H03F 3/16
[52] U.S. Cl. ..................................... 330/258; 330/253
[58] Field of Search ............... 330/252, 253, 256, 258, 330/259, 261, 277

[56] References Cited

U.S. PATENT DOCUMENTS

| | | | |
|---|---|---|---|
| 4,543,538 | 9/1985 | Fay | 330/252 X |
| 4,616,189 | 10/1986 | Pengue, Jr. | 330/258 X |

OTHER PUBLICATIONS

*IEEE Journal of Solid State circuits*, vol. SC-19, No. 1, Feb. 1984, p. 10.

*IEEE Journal of Solid State Circuits*, vol. SC-18, No. 3, Jun. 1983, p. 359.

*IEEE Technical Digest*, 1984 GaAs IC Symposium, p. 11.

*Primary Examiner*—Steven Mottola
*Attorney, Agent, or Firm*—John D. Winkelman; Daniel J. Bedell

[57] ABSTRACT

A differential amplifier includes a pair of input transistors for directing portions of a load current from a current source through a pair of load transistors in response to a differential input signal. A common mode output voltage of the differential amplifier is detected and applied to control terminals of a pair of feedback transistors. The feedback transistors couple the load transistors to a reference voltage and act therewith to provide control currents through the load transistors concurrent with the load currents. The control currents provide feedback that maintains the common mode output voltage at a constant threshold level.

12 Claims, 1 Drawing Sheet

DIFFERENTIAL AMPLIFIER WITH COMMON-MODE BIAS FEEDBACK

BACKGROUND OF THE INVENTION

This invention relates generally to differential amplifiers and in particular to a differential amplifier having a feedback circuit for stabilizing its common mode operating point and for tracking input threshold variations in digital logic circuits.

Gallium arsenide (GaAs) technology is advancing rapidly in research laboratories but has been slow to gain acceptance in commercial applications. Two factors contribute to the reluctance of system designers to incorporate GaAs components in their products: difficulties of interfacing GaAs components with the silicon bipolar circuitry presently in widespread use, and the limited range of integrated circuit components presently available in GaAs.

The difficulties of interfacing GaAs components with silicon bipolar circuitry stem from the different logic voltage levels required by the different integrated circuit families. Emitter Coupled Logic (ECL), for example, is a high-speed bipolar technology which typically operates at a reference, or common mode level, of −1.29 or −1.33 volts and has output swings of 500 millivolts above and below this level. Three-Diode Buffered FET Logic (BFL), one of the GaAs logic families, operates at a reference level of −0.5 volts and has output swings of 1 volt above and below this level.

The translation of logic signals from one such logic family to the other is complicated by the different temperature-response characteristics of the two materials. The reverse saturation current of a silicon diode junction, for example, doubles for every 10° C. rise in temperature. The forward voltage drop across a silicon junction drops 20 millivolts over the same range. Compensation for these temperature related effects is comparatively easy in a wholly silicon based system, since all the circuitry behaves similarly. When a GaAs circuit is interfaced through a translator circuit with a silicon circuit, however, the temperature drift of the silicon generated logic levels will not match the temperature drift of the GaAs logic levels. The translated silicon levels can thus drift away from the desired GaAs levels, causing the system performance to become marginal. Accordingly, proper temperature stabilization of silicon to GaAs translator circuits is an obstacle that must be overcome before GaAs components can enjoy widespread commercial acceptance.

The second factor slowing commercial acceptance of GaAs technology is the limited range of GaAs integrated circuits presently available. This limited range of components can be traced, in part, to the inherent difficulties of implementing certain circuit topologies satisfactorily in GaAs. Differential amplifiers, for example, have been widely used in the silicon integrated circuitry art as building blocks in components such as latches, shift registers and digital-to-analog converters. Optimization of such circuits in GaAs, however, is made difficult by the many problems inherent in GaAs technology which are not present with silicon. Some of these problems include: the inherently low gain of GaAs transistors, the difficulties of fabricating large value resistors and high impedance current sources, the poor matching of adjacent GaAs components, the wide process variations in the pinch-off voltage of GaAs field effect transistors (GaAsFETs) and the dependence of GaAsFET drain currents on drain to source voltages. Such factors make any symmetrical circuit topology, such as the differential amplifier, difficult to implement in GaAs. Consequently, GaAs circuits which rely on symmetrical topologies, such as logic families that use phase matched differential inputs or outputs, are unavailable.

In response to the interfacing problem, many designers have proposed circuits for translating bipolar ECL logic signals to gallium arsenide compatible levels. An input translator circuit is discussed in the "IEEE Journal of Solid State Circuits", Vol. SC-19, No. 1, February 1984, page 10. This circuit uses a reference voltage which is set by the ratio of the component GaAsFET gate widths. Such a scheme is highly dependent on the pinch-off voltages of the GaAsFETs used. These pinch-off voltages are again functions of ambient temperature, changing at the rate of −1 millivolt per °C., and are further subject to process induced variations of up to 600 millivolts.

An input circuit for Capacitively Coupled Logic (CCL) is disclosed in the "IEEE Journal of Solid State Circuits," Vol. SC-18, No. 3, June 1983, page 359. The amplifier uses a pair of GaAsFETs in a nominally differential configuration. Both of the inputs, however, are capacitively coupled by back-biased diodes. The text of the article indicates that one of the inputs can be used as a reference node tied to the drain voltage supply. The use of a DC voltage on a capacitively coupled input node, as taught by this article, causes one of the inputs of the nominally differential pair to float. The differential feature is thus disabled and the circuit operates as a single-ended amplifier. Furthermore, if the circuit were modified to enable differential operation, the outputs would not switch symmetrically about a center, common mode voltage. The absence of a symmetrical output swing, however, does not affect operation of the circuit, as described, because only a single output is used.

An input level translator circuit is also discussed in the "IEEE Technical Digest" from the 1984 GaAs IC Symposium, page 11. An external temperature compensation circuit designed for use with the translator circuit is shown in "Applications Brief 1: Power Supply Requirements for Giga-Bit's 10G Picobit Logic Family".

The GigaBit level translator is built about an inverting GaAsFET stage. The circuit's switching threshold voltage is set by the ratio of the inverting GaAsFET's gate width to the gate width of a pull-up GaAsFET. The input ECL signal is voltage shifted to be centered about the circuit's switching threshold.

The level shifting of the ECL input signal down to the circuit's switching threshold is effected by a string of series diodes between the ECL input and the gate of the inverting GaAsFET. The voltage drop provided by this series diode string may be varied slightly by varying the forward current passing through the diodes. This forward current is varied by changing a tri voltage that biases the diodes. The trim voltage is provided by a comparator circuit that compares an externally generated ECL reference voltage with an externally generated GaAs reference voltage.

The aforementioned Applications Brief indicates that the temperature compensation circuit is only effective over a 15° C. temperature range. The circuit is not compensated for process variations in the widths of the inverting and pullup GaAsFET gates, nor is the circuit compensated for process variations in the voltage dropping diodes. Finally, the trim voltage that "tweaks" the level translating circuit is externally generated and may not have the same temperature or process characteristics as the ECL and GaAs circuits with which the translator is being used.

U.S. Pat. No. 4,616,189, issued Oct. 7, 1986, discloses the use of a feedback loop to stabilize the common mode operating point of a differential amplifier. As illustrated in simplified form in FIG. 1 of the patent, the differential amplifier comprises source-coupled input transistors QA and QB routing a load current from a current source IA through load transistors QC and QD in response to a differential input voltage signal VIN. A level shifting circuit 10 shifts the voltage between the drains of transistors QA and QB to provide a differential output voltage signal VOUT. The feedback loop includes a matching pair of resistors RA and RB connected in series across the level shifting circuit 10 output to provide a common mode voltage VCM. An additional source-coupled pair of transistors QE and QF is provided with the drain-source path of transistor QF being connected between current source IA and the sources of transistors QA and QB. The drain of transistor QE is grounded. The common mode voltage VCM is level shifted by another shifting circuit 12 to provide a control voltage VX at the gate of transistor QF. A reference voltage VREF is applied to the gate of transistor QE. If the common mode voltage VCM rises above a threshold level, control voltage VX rises and causes transistor QF to increase the load current flowing through transistors QA and QB. The increased load current increases the voltage developed across load transistors QC and QD, thereby lowering the common mode voltage VCM. Similarly, when the common mode voltage VCM falls below the threshold level, VX falls causing transistor QF to reduce load current flow through transistors QA and QB, and causing the common mode voltage VCM to rise back up toward the threshold level. Thus, the threshold level tends to remain at a stable operating point.

The circuit of FIG. 1, above, provides a phase and amplitude matched "true" common mode output signal. However, the feedback loop has some disadvantages. Insertion of transistor QF into the path of the load current requires an increase in the minimum supply voltage differential $+V - (-V)$ needed for proper operation. Moreover, while the feedback loop improves common mode rejection when the frequency of the common mode input signal is low, when high common mode frequencies are present in the input signal, feedback becomes positive due to increased signal delay in the loop and causes the amplifier circuit to become unstable. Also, while the feedback loop provides good control over the common mode operating point at lower frequencies, the amplifier circuit does not necessarily permit the common mode operating point to track variations in input threshold level of a logic circuit that the amplifier may be driving. Such variation may occur as a result of temperature or process variations.

SUMMARY OF THE INVENTION

In accordance with the present invention, a differential amplifier includes a pair of input transistors that apportion load current from a current source through a pair of load transistors in response to a differential input signal. In accordance with one aspect of the invention, the common mode output voltage of the differential amplifier is detected and applied to control terminals of a pair of feedback transistors. The feedback transistors supply control currents though the load transistors in proportion to a difference between a reference voltage and the detected common mode voltage VCM. The control currents maintain the common mode output voltage at a constant threshold level. The feedback transistors are connected to the load transistors in parallel rather than in series with the input transistors so that the control currents do not pass though the input transistors. Thus, the input transistors provide a measure of common mode rejection that is independent of the feedback control loop.

The output signal of the differential amplifier may drive another circuit having input stage inverting amplifiers each formed by a pair of transistors connected in series between voltage sources. In accordance with another aspect of the invention, the reference voltage is adjusted so that the voltage across the load and feedback transistors matches the voltage across the transistor pairs of the input stage inverting amplifiers. In addition, the load and feedback transistors of the differential amplifier are sized to form inverting amplifiers each having a threshold voltage similar to the threshold voltage of the input stage inverting amplifiers of the driven circuit. This ensures that the common mode voltage VCM of the differential amplifier output signal tracks changes in threshold voltage of the driven circuit due to temperature or process variations.

It is accordingly an object of the invention to provide an improved differential amplifier having a common mode output voltage that matches a desired threshold voltage despite process variations and variations in ambient temperature.

The subject matter of the present invention is particularly pointed out and distinctly claimed in the concluding portion of this specification. However, both the organization and method of operation of the invention, together with further advantages and objects thereof, may best be understood by reference to the following description taken in connection with accompanying drawings wherein like reference characters refer to like elements.

DESCRIPTION OF THE PREFERRED EMBODIMENT

Figure 1:
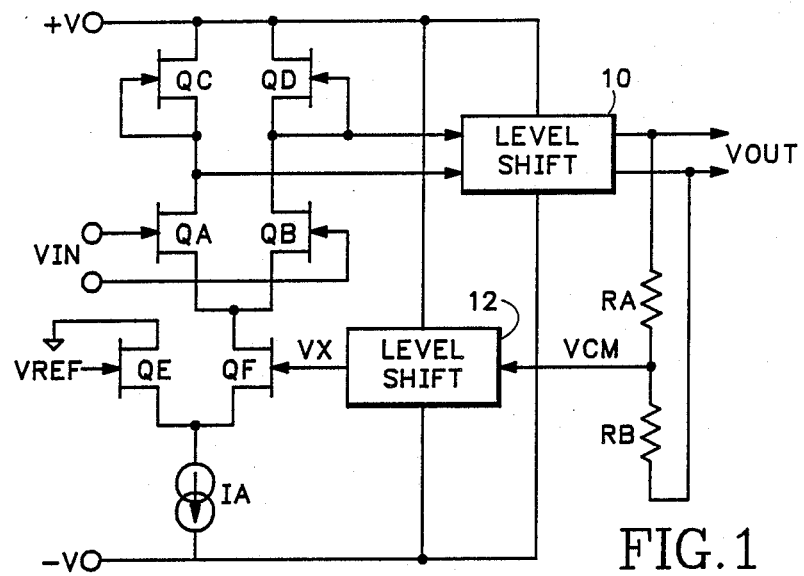
FIG. 1 is a schematic diagram of a differential amplifier of the prior art.
Figure 2:
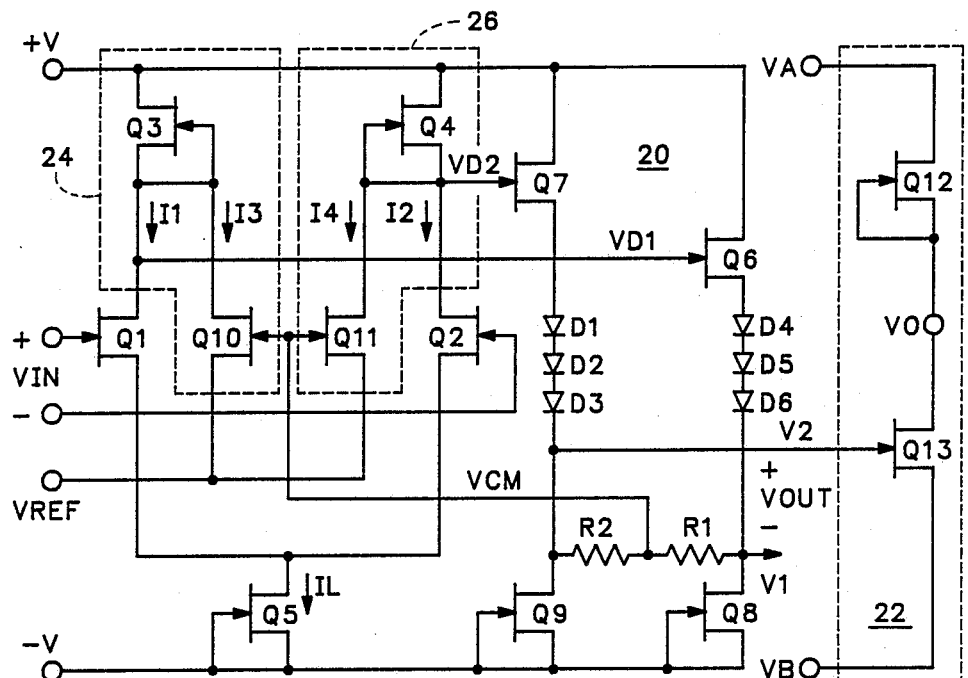
FIG. 2 is a schematic diagram of a differential amplifier in accordance with the present invention.

With reference to FIG. 2, a differential amplifier 20 in accordance with the present invention comprises transistors Q1–Q11, diodes D1–D6 and resistors R1 and R2. Transistors Q1–Q11 suitably comprise gallium arsenide field effect transistors (GaAsFETs). Input transistors Q1 and Q2 have drains respectively connected to both the gates and sources of load transistors Q3 and Q4 and have sources connected to a drain of transistor Q5. The drains of load transistors Q3 and Q4 are tied to a positive voltage source $+V$ and the gate and source of transistor Q5 are tied to a negative voltage source $-V$. Transistor Q5 is a current source providing load currents I1 and I2 through load transistors Q3 and Q4, respectively, by way of input transistors Q1 and Q2. The sum of currents I1 and I2 is constant but the magnitudes of currents I1 and I2 relative to one another vary in accordance with a differential amplifier input voltage signal VIN applied across gates of input transistors Q1 and Q2.

The sources of transistors Q3 and Q4 are also respectively coupled to the gates of transistors Q6 and Q7. Diodes D1–D3 are connected in series between the source of transistor Q6 and the drain of transistor Q8. Similarly, diodes D4–D6 are connected in series between the source of transistor Q7 and the drain of transistor Q9. The drains of transistors Q6 and Q7 are tied to +V while the gates and sources of transistors Q8 and Q9 are tied to −V. Transistors Q6 and Q8 and diodes D1–D3 level shift the drain voltage VD1 of transistor Q1 downward by an amount equal to the sum of forward bias voltages of diodes D1–D3 to provide a single-ended output voltage signal V1 at the drain of transistor Q8. Transistors Q7 and Q9 and diodes D4–D6 level shift the drain voltage VD2 of transistor Q2 downward by a similar amount to provide another single-ended output voltage signal V2 at the drain of transistor Q9. Single ended voltage signals V1 and V2 together form the differential output voltage VOU of amplifier 20.

When input voltage signal VIN is positive, current I1 is larger than current I2 and the drain voltage VD1 of transistor Q1 is driven below the drain voltage VD2 of transistor Q2. Thus, output signal V1 is lower in voltage than output signal V2 so that the differential output voltage VOUT is positive. When input voltage signal VIN is negative current I1 is smaller than current I2 and drain voltage VD2 is driven below drain voltage VD1. Thus, output signal V1 is higher in voltage than output signal V and the differential output signal VOUT is negative.

In accordance with the invention, matching resistors R1 and R2 are connected in series between the drains of transistors Q8 and Q9 so that a common mode voltage VCM is developed at the junction between resistors R1 and R2. The common mode voltage signal VCM drives the gates of feedback transistors Q10 and Q11. The drain of transistor Q10 is tied to the gate and source of transistor Q3 and the drain of transistor Q11 is tied to the gate and source of transistor Q4. An input reference voltage VREF controls the sources of both transistors Q10 and Q11.

The common mode output voltage of the amplifier of FIG. 2 is the average of the single-ended output voltages V1 and V2. Since resistors R1 and R2 are of the same size resistors R1 and R2 form a device that senses the amplifier's common mode output voltage and applies it to the gates of transistors Q10 and Q11. Feedback transistors Q10 and Q11 respectively supply feedback control currents I3 and I4 through the drain-source paths of load transistors Q3 and Q4. The control currents augment the load currents I1 and I2 also flowing through transistors Q3 and Q4.

When the common mode voltage VCM rises above a threshold level, feedback transistors Q10 and Q11 turn on harder and increase both feedback currents I3 and I4. The potential drops across load transistors Q3 and Q4 increase so as to drive down both drain voltages VD1 and VD2. The output voltage signals V1 and V2 follow the fall in drain voltages VD1 and VD2 so that the common mode voltage VCM, the average of V1 and V2, falls back down toward the threshold level. Conversely, when the common mode voltage VCM falls below the threshold level, currents I3 and I4 decrease thereby decreasing the voltage drops across transistors Q3 and Q4 and allowing the voltages at the drains of both transistors Q1 and Q2 to rise. The output voltage signals V1 and V2 rise with these drain voltages so that common mode voltage VCM rises back up toward the threshold level. Thus, the control currents I3 and I4 provide negative feedback to the amplifier to maintain the common mode voltage VCM at a substantially constant threshold level.

Since the control currents I3 and I4 do not pass through the input transistors Q1 and Q2, the differential amplifier 20 affords a measure of common mode rejection that is independent of the feedback control loop provided by resistors R1 and R2 and transistors Q10 and Q11. The feedback loop improves the common mode rejection characteristics of the differential amplifier over the frequency range for which feedback is effective and the feedback loop does not substantially hamper common mode rejection or cause circuit instability at higher common mode frequencies.

The threshold level to which the common mode voltage VCM is held is determined by the magnitudes of reference voltage VREF and source voltage +V, and by relative sizing of transistors Q3, Q4, Q5, Q10 and Q11. This threshold level is preferably adjusted to match input logic threshold levels of logic circuits driven by the output signals V1 and V2 so as to provide maximal noise margin. In a typical application the single-ended output signals V1 and V2 of the differential amplifier drive another circuit having input stage inverting amplifiers formed by transistor pairs connected in series between voltage sources. One such input stage inverting amplifier 22, shown in FIG. 2, includes a load transistor Q12 and an input transistor Q13. The drain of transistor Q12 is connected to one voltage source VA and the source of transistor Q13 is connected to another voltage source VB of more negative (or less positive) potential than VA. The drain of transistor Q13 is tied to the gate and source of transistor Q12. The output signal V2 drives the gate of transistor Q13. An inverting amplifier output signal VO is developed at the drain of transistor Q13. The single-ended voltage signal V1 may also drive an input stage inverting amplifier (not shown) that is similar to amplifier 22.

In accordance with the invention, the reference voltage VREF is adjusted to equal VB, and the voltage source +V is set equal to VA so that the voltage (+V−VREF) across the load and feedback transistors Q4 and Q11 matches the voltage (VA - VB) across transistors Q12 and Q13 of inverting amplifier 22. In addition, the load and feedback transistors Q4 and Q11 are sized to form an inverting amplifier 26 having a threshold voltage similar to the threshold voltage of inverting amplifier 22. In particular, transistors Q4 and Q11 are sized such that $$(W4-W5/2)/W11 = W12/W13$$

where W4, W5, W11, W12, W13 are the channel widths (or current capacity) of transistors Q4, Q5, Q11, Q12 and Q13 respectively. Assuming, for example, that transistors Q11 and Q13 are of the same size, the width W3 of load transistor Q4 is increased above that of corresponding load transistor Q12 by one half the size of transistor Q5. To understand why this is done, assume that VIN is 0. In such case single-ended output voltages V1 and V2 and the common mode voltage VCM are all of equal voltage. Thus, the gates of both transistors Q11 and Q13 are at the level of the common mode voltage VCM. In order that amplifiers 22 and 26 have the same threshold level, transistors Q11 and Q13 must conduct the same amount of current. But transistor Q4 conducts more current than transistor Q12 because it conducts not only the control current I4 passing through transistor Q11 but also the load current I2 passing through transistor Q2. Since VIN is at 0 volts, input transistors Q1 and Q2 conduct the same amount of current, ne half the capacity of current source transistor Q5. Thus, load transistor Q4 must be larger than load transistor Q12 by one half the size of current source transistor Q5 when transistors Q11 and Q13 are of similar size. Transistors Q3 and Q10 are sized in a similar manner to form an inverting amplifier 24 having a threshold voltage similar to the threshold voltage of another input stage inverting amplifier (not shown) similar to amplifier 22, the other input stage inverting amplifier being driven by output signal V1.

When amplifiers 20 and 22 are implemented on the same integrated circuit, setting +V and VREF and sizing transistors Q3, Q4, Q10 and Q11 in the above-described manner ensures that the common mode output voltage VCM tracks changes in the threshold voltage of a circuit driven by the differential amplifier 20 as may arise due to variation in ambient temperature or due to variation in circuit fabrication process.

There has thus been described an improved differential amplifier in which the common mode output voltage of the differential amplifier is detected and applied to control terminals of a pair of feedback transistors. The feedback transistors couple load transistors of the differential amplifier to a reference voltage to provide feedback to the amplifier for maintaining the common mode output voltage at a substantially constant threshold level. In addition, the magnitude of the reference voltage and the relative sizes of the load and feedback transistors are adjusted so that inverting amplifiers formed by the load and feedback transistors have a threshold voltage similar to the threshold voltage of input stage inverting amplifiers of a circuit driven by the differential amplifier output signal.

The preferred embodiment of the invention employs gallium arsenide field effect transistors, but it will be apparent to those skilled in the art that the invention may be practiced using many other types of transistors. It will also be apparent to those skilled in the art that many other changes and modifications may be made without departing from the invention in its broader aspects. The appended claims are therefore intended to cover all such changes and modifications as fall within the true spirit and scope of the invention.

I claim:

1. A differential amplifier compensated for temperature and process variations comprising:
    first load means coupling a first circuit node to a supply voltage input,
    second load means coupling a second circuit node to a supply voltage input,
    current control means connected to said first and second circuit nodes for apportionably directing a load current through said first and second load means in response to an input signal, and
    feedback means connected to said first and second circuit nodes for supplying control currents through said first and second load means via said first and second nodes of magnitude determined by a common mode voltage of a differential signal developed between said first and second nodes in response to said load and control currents flowing through said first and second load means.

2. The differential amplifier in accordance with claim 1 wherein said feedback means comprises:
    sampling means coupled to said first and second circuit nodes for generating a control signal of magnitude determined by said common mode voltage, and
    control means coupled to said first and second circuit nodes for supplying control currents through said first and second load means in response to said control signal.

3. The differential amplifier in accordance with claim 2 wherein said control currents supplied by said control means are of magnitudes that increase with the magnitude of said control signal.

4. The differential amplifier in accordance with claim 1 wherein said input signal is a differential signal and wherein said current control means comprises:
    a current source for supplying said load current;
    a first input transistor having load terminals connected between said current source and said first circuit node and having a first control terminal; and
    a second input transistor having load terminals connected between said current source and said second circuit node and having a second control terminal, said first and second input transistors directing portions of said load current through their load terminals and said first and second load means in response to said input signal applied between said first and second control terminals.

5. A differential amplifier compensated for temperature and process variations comprising:
    first load means coupling a first circuit node to a supply voltage input,
    second load means coupling a second circuit node to said supply voltage input,
    current control means connected to said first and second circuit node for apportionably directing a load current through said first and second load means in response to an input signal,
    a first feedback transistor having load terminals connected between said first circuit node and a reference voltage input and having a third control terminal,
    a second feedback transistor having load terminals connected between said second circuit node and said reference voltage input and having a fourth control terminal, and
    sampling means coupled to said first and second circuit nodes for generating a control signal applied to said third and fourth control terminals.

6. The differential amplifier in accordance with claim 5 wherein said control signal is indicative of a common mode voltage of a differential signal developed between said first and second circuit nodes.

7. The differential amplifier in accordance with claim 5 wherein said input signal is a differential signal and wherein said current control means comprises:
    a current source for supplying said load current;
    a first input transistor having load terminals connected between said current source and said first circuit node and having a first control terminal; and
    a second input transistor having load terminals connected between said current source and said second circuit node and having a second control terminal, said first and second input transistors directing portions of said load current through their load terminals and said first and second load means in response to said input signal applied between said first and second control terminals.

8. A differential amplifier compensated for temperature and process variations comprising:
   a first load transistor having load terminals coupled between a first circuit node and a supply voltage input and having a control terminal connected to said first circuit node,
   a second load transistor having load terminals coupled between a second circuit node and said supply voltage input and having a control terminal connected to said second circuit node,
   current control means connected to said first and second circuit nodes for directing portions of a load current through said first and second load transistors in response to an input signal,
   a first feedback transistor having load terminals connected between said first circuit node and a reference voltage input and having a first control terminal,
   a second feedback transistor having load terminals connected between said second circuit node and said reference voltage input and having a second control terminal, and
   sampling means coupled to said first and second circuit nodes for generating a control signal applied to said first and second control terminals of said first and second feedback transistors.

9. The differential amplifier in accordance with claim 8 wherein said control signal varies in magnitude with a common mode voltage of a differential signal developed between said first and second circuit nodes.

10. The differential amplifier in accordance with claim 8 wherein said input signal is a differential signal and wherein said current control means comprises:
   a current source for supplying said load current;
   a first input transistor having load terminals connected between said current source and said first circuit node and having a third control terminal; and
   a second input transistor having load terminals connected between said current source and said second circuit node and having a fourth control terminal, said first and second input transistors directing portions of said load current through their load terminals and said first and second load transistors in response to said input signal applied between said third and fourth control terminals of said first and second input transistors.

11. A differential amplifier for providing an input to a first inverting amplifier comprising a first transistor having load terminals coupled between a first supply voltage input and an output node and a second transistor having load terminals coupled between a second supply voltage input and said output node, said first inverting amplifier having a first threshold voltage, said differential amplifier comprising:
   a first load transistor having load terminals coupled between a first circuit node and a third supply voltage input and having a control terminal coupled to said first circuit node;
   a second load transistor having load terminals coupled between a second circuit node and said third supply voltage input and having a control terminal coupled to said second circuit node;
   current control means connected to said first and second circuit node for directing portions of a load current through said first and second load transistors in response to an input signal;
   a first feedback transistor having load terminals connected between said first circuit node and a reference voltage input and having a third control terminal, said first load and feedback transistors forming a second inverting amplifier having a threshold voltage substantially similar to the threshold voltage of said first inverting amplifier;
   a second feedback transistor having load terminals connected between said second circuit node and said reference voltage input and having a fourth control terminal, said second load and feedback transistors forming a third inverting amplifier having a threshold voltage substantially similar to the threshold voltage of said first inverting amplifier; and
   means coupled to said first and second circuit nodes for generating first and second single-ended signals in response to signals developed at said first and second circuit nodes and for generating a control signal applied to said third and fourth control terminals, said control signal changing with a common mode voltage of a differential output signal formed by said first and second single-ended signals.

12. The differential amplifier in accordance with claim 11 wherein said input signal is a differential signal and wherein said current control means comprises:
   a current source for supplying said load current;
   a first input transistor having load terminals connected between said current source and said first circuit node and having a third control terminal; and
   a second input transistor having load terminals connected between said current source and said second circuit node and having a fourth control terminal, said first and second input transistors directing portions of said load current through their load terminals and said first and second load transistors in response to said input signal applied between said third and fourth control terminals of said first and second input transistors.

* * * * *